US 6,703,875 B1

(12) United States Patent
Chuang

(10) Patent No.: US 6,703,875 B1
(45) Date of Patent: Mar. 9, 2004

(54) DEVICE FOR EMULATING PHASE-LOCKED LOOP AND METHOD FOR SAME

(75) Inventor: Tsu-Yau Chuang, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/209,611

(22) Filed: Jul. 29, 2002

(51) Int. Cl.[7] .................................................. H03L 7/00
(52) U.S. Cl. ....................... 327/144; 327/159; 331/1 A; 375/376
(58) Field of Search ................................ 327/144–147, 327/150, 151, 155, 156, 160, 159; 375/373, 375, 376; 331/DIG. 2, 1 A

(56) References Cited

U.S. PATENT DOCUMENTS 5,295,079 A * 3/1994 Wong et al. ................. 714/715
6,078,633 A * 6/2000 Shiotsu et al. .............. 375/374
6,366,174 B1 * 4/2002 Berry et al. .................. 331/78
6,404,249 B2 * 6/2002 Hayashida ................... 327/159

* cited by examiner

Primary Examiner—Minh Nguyen

(57) ABSTRACT

The device has a correction table for storing a digital pattern describing how a frequency of a signal is to be altered. The device also has first logic for receiving a sample signal and altering its frequency based on the correction table output to produce a desired output signal that is near a desired frequency. The first logic accomplishes this by dividing the frequency of the sample signal by a first or a second integer based on the correction table output. Further, the device has second logic for adjusting the frequency of the output signal to the approximate frequency of a reference signal. Additionally, the device has comparison logic for comparing the reference signal with the adjusted output signal and modifying the output of the correction table to substantially phase-lock the output signal to the reference signal.

27 Claims, 4 Drawing Sheets

120

0100_1010_0101_0100_1010_0101_0100_1010
1010_1001_0100_1010_1001_0100_1010_1001
1001_0101_0010_1001_0101_0010_1001_0100
0101_0010_1010_0101_0010_1010_0101_0010

500

BEGIN
↓
510 Frequency Divide Logic Receives Base Signal and Frequency Modification Signal
↓
520 Frequency Divide Logic Divides Frequency of Base Signal to Produce Desired Output Signal
↓
530 Adjust Desired Output to Substantially Match Reference Signal's Frequency for Comparison
↓
540 Compare Signals and Alter Frequency Modification Signal to Phase-Lock Desired Signal to Reference Signal
↓
END

DEVICE FOR EMULATING PHASE-LOCKED LOOP AND METHOD FOR SAME

FIELD OF THE INVENTION

The present invention relates to the field of synchronizing signals. Specifically, embodiments of the present invention relate to a device and method for emulating a phase-locked loop.

BACKGROUND ART

There are many applications in which it is desirable to create one or more signals that are phase-locked to a reference signal that is at a different frequency from the signal or signals. For example, a device in a network may synchronize an internal clock to a network clock in order to allow internal components that run at different frequencies than the network clock to be able to communicate on the network.

Standards for the accuracy of the internal clock, as well as the degree to which it is synchronized to the reference network clock, have been defined by the American National Standards Institute (ANSI). For example, ANSI has defined performance requirements regarding clocks in digital networks in the document entitled, "Synchronization Interface Standards for Digital Networks," ANSI/T1.101-1998. In particular, that standard defines four stratum levels (and additional substrata). Stratum 1 has the most stringent requirements and the clock may be a completely autonomous source of timing. On the other hand, stratum-2, stratum-3, and stratum-4 may track an input clock at the same or a higher stratum level. Stratum-4 has the least stringent timing requirements.

One type of device within a network that may need to synchronize to a network reference clock is customer premises equipment (CPE). For example, CPEs often derive a reference clock from the network to drive their backplane TDM (Time Division Multiplexing) bus and may also pass one or more clocks downstream to other devices. Being at the lower end of the network, CPEs generally are not subject to the most stringent clock standards and as such, may only need to meet the requirements of stratum-4 or stratum-4E. Thus, CPEs may synchronize to a network clock that is a stratum-4 clock or higher.

Conventionally, a phase-locked loop may be used to frequency and phase-lock to a clock such as a network clock, while meeting stratum-4 or stratum-4E requirements for the internal synchronized clock. The phase-locked loop may generate multiple clocks that are at frequencies other than the network clock, but phase-locked to it. However, conventional phase-locked loops have several drawbacks.

One problem with conventional digital phase-locked loops is that they are generally designed to lock to a specific reference frequency. For example, the digital phase-locked loop may have a reference oscillator that is either some integral multiple or very close to an integral multiple of the desired frequency. The reference frequency to which it locks must be at or very near the frequency of the reference oscillator. Frequently, this is on the order of Megahertz. If the reference frequency is not near the frequency for which the phase-locked loop was designed, then it will not function and a different phase-locked loop will be required. Sometimes, a custom phase-locked loop that is able to synchronize to the desired frequency must be built.

A further drawback with conventional phase-locked loops is that they add considerable cost to the system. For example, analog phase-locked loops require external components such as resistors and capacitors to implement loop filters to tune to the desired frequency, thus adding considerable expense.

Additionally, the external components may be temperature sensitive and hence the designer must factor in possible temperature variations. If the designer fails to properly do so, the phase-locked loop may fail to accurately synchronize to the reference.

Therefore, it would be advantageous to provide a method and device for providing a phase-locked loop to synchronize an output signal to a reference signal. It would be further advantageous if the method and device is able to phase-lock to a network reference clock. It would be further advantageous that the output signal is a clock that is ANSI stratum-4 compliant. It would be still further advantageous that the above method and device is cost efficient. It would be even further advantageous if the method and device is not highly sensitive to temperature variations.

SUMMARY OF THE INVENTION

Embodiments of the present invention provide a method and device for emulating a phase-locked loop that may synchronize an output signal to a reference signal. Embodiments of the present invention phase-lock to a network reference clock. Embodiments of the present invention provide a clock signal that is ANSI stratum-4 compliant. Embodiments of the present invention are cost efficient. Embodiments of the present invention are not highly sensitive to temperature variations.

A device for emulating a phase-locked loop is disclosed. The device comprises a correction table for storing a digital pattern describing how a frequency of a signal is to be altered. The device also has first logic for receiving a sample signal and altering its frequency based on the correction table output to produce a desired output signal that is near a desired frequency. The first logic accomplishes this by dividing the frequency of the sample signal by a first or a second integer based on the correction table output. Further, the device has second logic for adjusting the frequency of the output signal to the approximate frequency of a reference signal. Additionally, the device has comparison logic for comparing the reference signal with the adjusted output signal and modifying the output of the correction table to substantially phase-lock the output signal to the reference signal.

Another embodiment provides for a method of emulating a phase-locked loop. The method comprises receiving a base signal and a frequency modification signal into logic for altering a frequency of a signal. To produce an output signal, the frequency of the base signal is divided by a first integer if the frequency modification signal is a first value and divided by a second integer if the frequency modification signal is a second value. The frequency of the output signal is altered to substantially match a frequency of a reference signal. The altered output signal fed back and compared to the reference signal. Then, the frequency modification signal is modified in response to the comparison to substantially phase lock the output signal to the reference signal.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 5 is a flowchart illustrating steps of a method of emulating a phase-locked loop, according to an embodiment of the present invention.

DETAILED DESCRIPTION OF THE INVENTION

Figure 1:
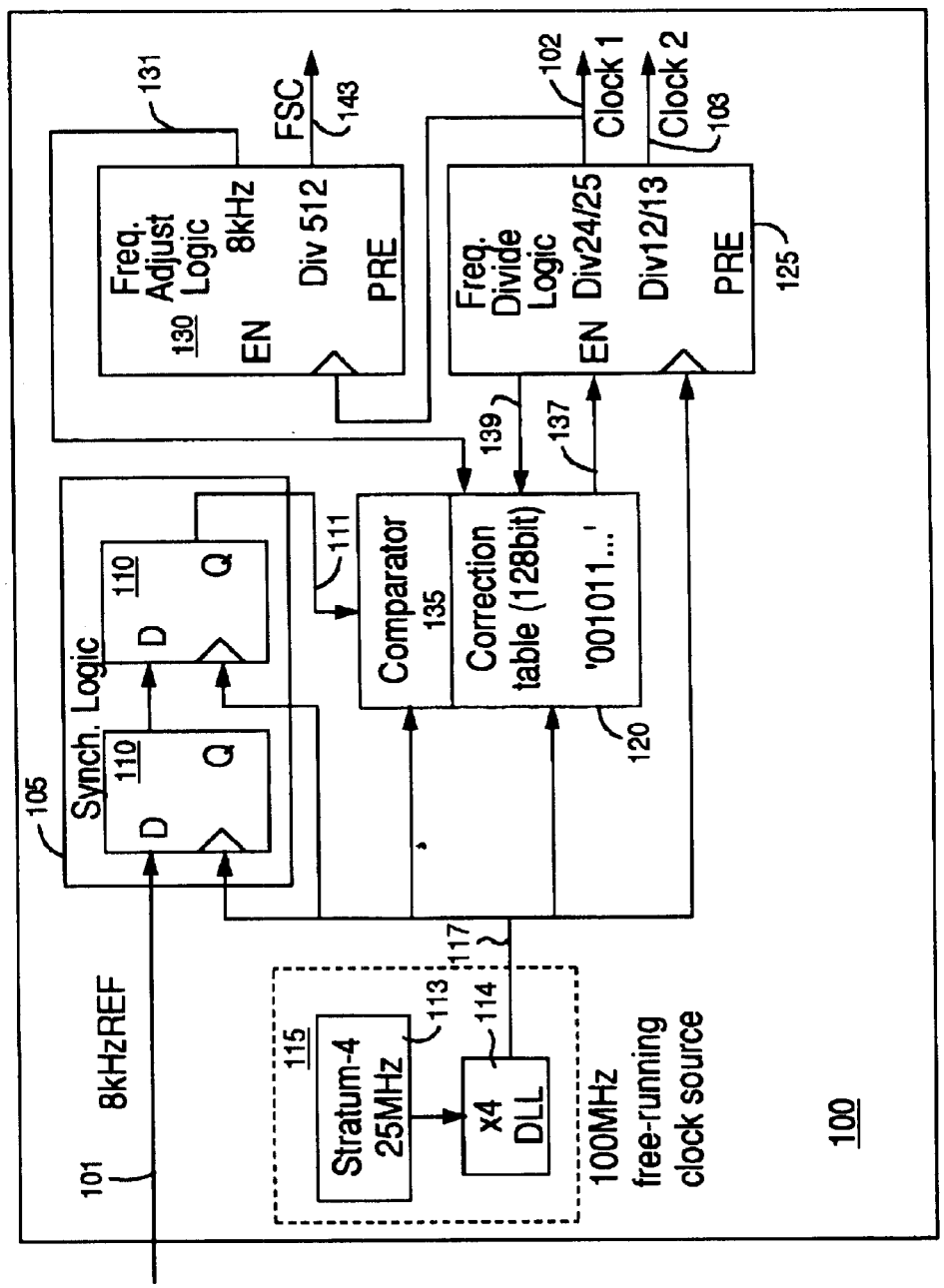
FIG. 1 is a block diagram of a device for emulating a phase-locked loop, according to an embodiment of the present invention.

In the following detailed description of the present invention, a method and device for emulating a phase-locked loop, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

An embodiment of the present invention is a device for emulating a phase-locked loop (PLL). The emulated PLL is able to phase-lock one or more output signals to an input reference signal. In one embodiment, the input reference signal is a network clock, although various embodiments of the present invention may phase-lock to other reference signals. In one embodiment, the one or more output signals are clocks used to drive components in CPEs and may be sent downstream.

Basic operation of the embodiment of FIG. 1 may be as follows. In this embodiment, the input is an 8 kHz reference input 101 and the clock 1 and clock 2 outputs are a 4.096 MHz clock 102 and an 8.192 MHz clock 103, which the device 100 phase-locks to the reference signal 101. However, the present invention is well suited to synchronizing to other references at other frequencies and producing outputs at other frequencies. The device has a 100 MHz free-running clock source 115 for producing a free-running clock 117 that the device 100 divides in frequency to produce the output clocks 102, 103. The frequency of the free-running clock 117 is generally not an exact integer multiple of the output clocks 102, 103. To produce an output clock 102, 103, the frequency of the free-running clock 117 is sometimes divided by a first integer at other times divided by a second integer. For example, to produce the 4.096 MHz clock 102, the free-running clock 117 is divided in frequency by 24 for 212 out of 512 free-running clock cycles and by 25 for the rest of the cycles.

The correction table 120 contains a pattern of zeros and ones that are input to the frequency divide logic 125. The pattern is designed to cause the frequency divide logic 125 to modify the frequency of the free-running clock 117 (e.g., a base clock) to a suitable frequency and output this as the 4.096 MHz signal, for example. The 4.096 MHz clock 102 is fed into frequency adjustment logic 130, where its frequency is adjusted to substantially match the reference signal's 101 frequency. This frequency-adjusted signal 131 is fed back into the comparator 135.

Since the 8 kHz input reference signal is asynchronous with respect to the free-running clock 117, the synchronization logic 105 synchronizes the input reference signal 101 to the free-running clock 117. Finally, the synchronized reference clock 111 is fed into the comparator 135 and compared to the frequency-adjusted signal 131. Based on this comparison, the correction table 120 output is modified so that the synchronized reference clock 111 and the frequency adjusted signal 131 are substantially frequency and phase-locked. For example, if the frequency adjusted signal 130 lags the synchronized reference clock 111, the output of the correction table 120 is modified by converting a one to a zero. In this fashion, the output clocks 102, 103 are phase-locked to the reference signal 101.

FIG. 1 will now be discussed in more detail. The reference signal 101 received into the device 100 may be an 8 kHz pulse that is used as a timing reference. The free-running clock source 115, in this embodiment, is implemented with a 25 MHz Stratum-4 clock 113 that is multiplied in frequency by four by a delayed lock loop (DLL) 114 to produce a 100 MHz free-running clock 117. Other frequencies than 100 MHz are suitable. The DLL may be a type of phase-locked loop. However, the methodology of producing the 100 MHz free-running clock 117 is not limited to the logic shown. For example, a more accurate clock, such as a Stratum-3 clock may be used. However, as CPEs generally require only a Stratum-4 clock, a more accurate clock is generally not required.

Furthermore, the free-running clock 117 may be received to the device 100 from any convenient source. For example, CPEs will generally have at least one clock source available for other purposes. The output clocks 102, 103 may have a frequency that is not a whole integer fraction of the free-running clock 117. For example, in one embodiment, the free-running clock is 100 MHz and the output signal is either 4.096 MHz or 8.192 MHz. The accuracy (e.g., parts per million or ppm) and jitter characteristics may be determined by the depth of the sampling time and the frequency of the free-running clock 117.

The reference signal 101 and free-running clock 117 are input to the synchronization logic 105, which in this embodiment comprises a pair of D flip-flops 110. However, the synchronization logic 105 may be implemented in other fashions. Thus, the synchronization logic 105 outputs the reference signal 101 synchronized to the free-running clock 117 (e.g., a synchronized reference signal 111).

The correction table 120 contains a pattern of ones and zeroes that carry information to produce the output clocks 102, 103 from the free-running clock 117. The correction table output, which serves as a frequency modification signal 137, is fed into the enable of the frequency divide logic 125. The frequency divide logic 125 may issue a signal 139 to the correction table 120 to cause a transfer of one or more bits from the correction table 120. As discussed herein, the frequency modification signal 137 may be modified to adjust the output clocks 102, 103 and hence to establish precise output clocks that are phase-locked to the reference signal 101. More details of the composition of the correction table 120 are discussed herein with respect to FIG. 2.

The frequency divide logic 125 may be implemented with a counter that toggles the output clocks 102, 103 after a pre-determined number of free-running clock 117 cycles have transpired. The pre-determined number may be a first integer or a second integer, based on the frequency modification signal 137. For example, if the frequency modification signal 137 is currently a '0', the frequency divide logic 125 may establish the period of the output clock 102 as 24 free-running clock cycles. On the other hand, if the frequency modification signal 137 is currently a '1', the frequency divide logic 125 may establish the period of the output clock 102 as 25 free-running clock cycles. The frequency divide logic 125 may obtain the next bit from the frequency modification signal 137 as needed after counting down the 24 or 25 free-running clock cycles from the previous bit. In one embodiment, the frequency divide logic 125 is implemented with a five-bit counter, which toggles the output clocks 102, 103 after a suitable number of counts of the free-running clock 117 have passed. However, embodiments of the present invention are well-suited to implementing the frequency divide logic 125 in other fashions.

The frequency adjustment logic 130 may be implemented with a ten-bit counter. In particular, the 4.096 MHz output clock 102 may be fed into the frequency adjustment logic 130 clock input. The enable may be set at all times and the ten-bit counter may be set to toggle (up or down as appropriate) after every 512 counts of the 4.096 MHz output clock 102. Thus, the frequency of the 4.096 MHz output clock 102 is divided by 512 to produce an 8 kHz clock that may be referred to as an frequency adjusted signal 131. This signal 131 is fed back to the comparator 135. The frequency adjustment logic 130 also outputs an 8 kHz frame synchronization pulse (e.g., FSC signal) 143. The pulse width and hence duty cycle of these signals 131, 143 may established by setting the 10-bit counter to toggle down a predetermined number of 4.096 MHz output clock 102 cycles after it toggled up, for example. Thus, the duty cycle of the signals 131, 143 need not be the same as the 4.096 MHz output clock 102.

The various components in the device 100 may be implemented within a field programmable gate array (FPGA), an application specific integrated circuit (ASIC), etc. Just as the free-running clock 117 may already be available, a CPE may already have an FPGA or the like that is suitable to implement device 100. Thus, unlike conventional solutions that require one or more additional components to be added to the system, embodiments of the present invention do not require additional components than already exist.

Figures 2, 3:
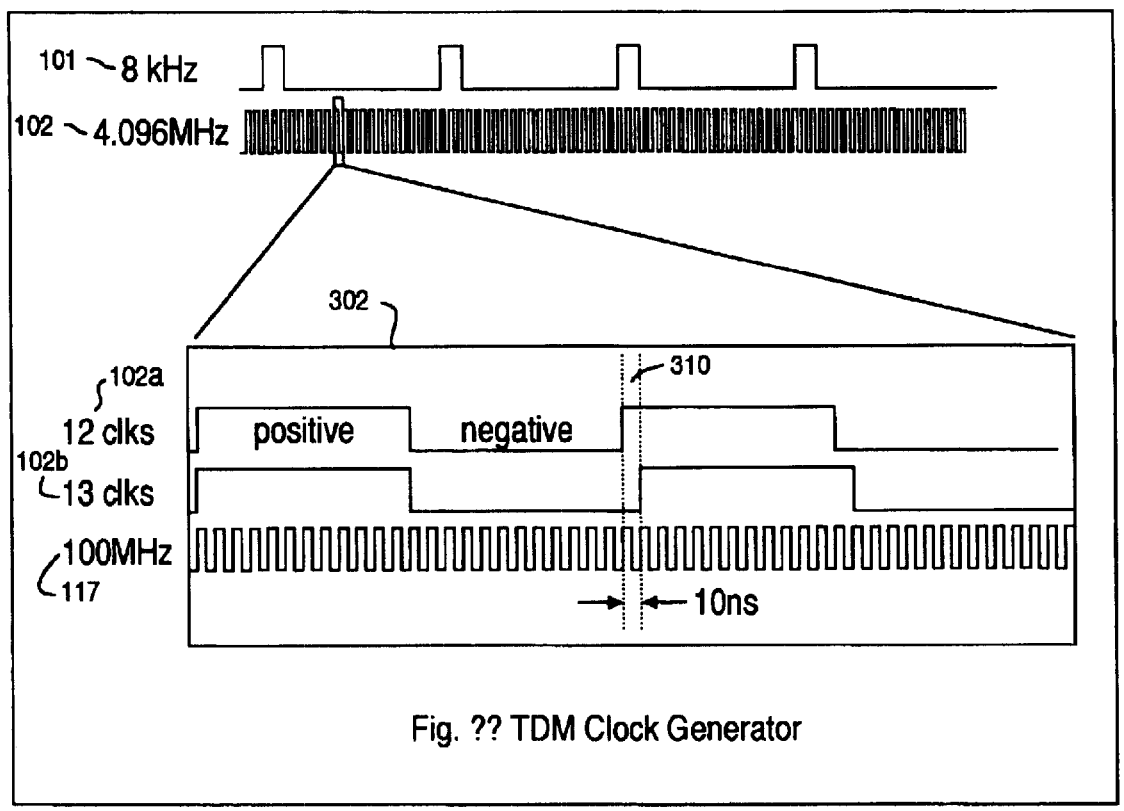
FIG. 2 is an exemplary table comprising frequency compensation information, according to an embodiment of the present invention.
FIG. 3 is a timing diagram illustrating signal formation and cycle-to-cycle jitter, according to an embodiment of the present invention.

Referring now to FIG. 2, an exemplary correction table 120 is shown. In this embodiment, the correction table 120 has 128 bits that are arranged in a pattern that allows the output clocks 102, 103 to maintain a 50% duty cycle. If other duty cycles are desired, a different pattern may be used. Given that the reference signal 101 is an 8 kHz clock and the free-running clock 117 is 100 MHz, during one reference clock frame (e.g., 125 microseconds) there will be 512 free-running clock 117 cycles. Thus, the 128 bit correction table 120 may be accessed by the frequency divide logic 125 four times per frame. The number of bits in the correction table 120 may be otherwise to allow for other free-running clock 117 frequencies, output clocks, etc. For example, the ratio of the frequency of the free-running clock 117 to the output clock 102 affects how many bits are needed to obtain a given accuracy.

In various embodiments of the present invention, the correction table 120 content is modified to allow the device 100 to synchronize to a different frequency reference signal 101, to create a different frequency output signal, or to make both adjustments. For example, the correction table 120 may be implemented in RAM, flash memory, etc.

As discussed herein, the 4.096 MHz output clock 102 may comprise either 24 or 25 free-running clock 117 cycles. Referring now to FIG. 3, some details relating to formation of the 4.096 MHz output clock 102 and its accuracy will be discussed. FIG. 3 shows a portion of an 8 kHz reference signal 101 and a 4.096 MHz output clock 102 near the top of the figure. At the bottom is a magnified region 302 showing a portion of two exemplary 4.096 MHz output clocks 102 compared to a 100 MHz free-running clock 117.

FIG. 3 shows the upper exemplary 4.096 MHz output clock 102*a* having twelve free-running clocks 117 for all of its phases. However, the lower 4.096 MHz output clock 102*b* is shown having thirteen 100 MHz free-running clock 117 cycles for the negative phase of its first cycle. In one embodiment, the positive phase of the output clock 102 always has twelve free-running clocks 117 cycles. It is the negative phase that is either twelve or thirteen clock cycles. Maintaining the positive phase at the same width may provide timing benefits for devices that sample the 4.096 MHz output clock 102. For example, in an embodiment in which the device 100 is used in customer premise equipment in a communications network, most of the devices in the CPE sample on the falling edge of the 4.096 MHz output clock 102, so the positive clock phase is maintained at twelve free-running clock cycles. However, the opposite could be true to benefit other devices.

Still referring to FIG. 3, there may be a cycle-to-cycle jitter 310 of 1/frequency of the free-running clock 117. Thus, in FIG. 3 the jitter 310 is shown as ten nanoseconds. Therefore, embodiments of the present invention are able to produce a output clocks 102, 103 that have a jitter within acceptable tolerance by selecting an appropriate frequency for the free-running clock 117. The quality of the free-running clock 117 itself will also affect the quality of the output clocks 102, 103. Thus, if desired, the free-running clock 117 maybe produced from a higher quality clock. However, for most applications in present CPEs that require a stratum-4 quality clock, the quality of the output clocks 102, 103 will be sufficient if the free-running clock 117 is derived from a stratum-4 level clock.

Figure 4A:
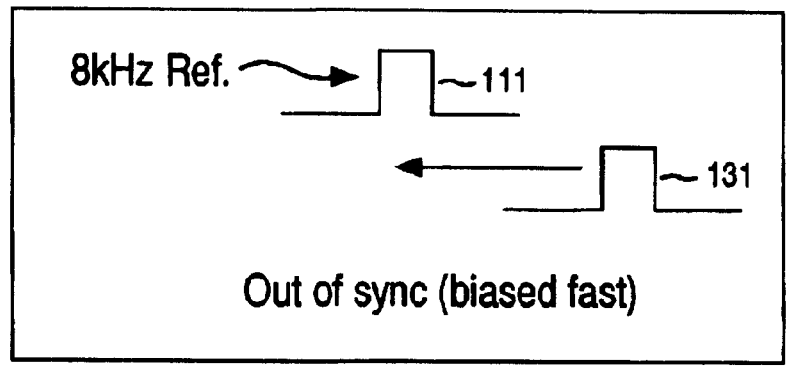
FIG. 4A and FIG. 4B are diagrams illustrating synchronization of a signal to a reference signal, according to embodiments of the present invention.

As discussed herein, the synchronized reference clock 111 is compared to the frequency adjusted signal 131 to phase and frequency lock those signals. FIG. 4A illustrates an 8 kHz synchronized reference clock 111 is being compared with a frequency adjusted signal 131 that was produced by the frequency adjustment logic 130. In this case, the frequency adjusted signal 131 is lagging the 8 kHz synchronized reference clock 111.

The comparison may be performed as follows. The comparator logic 135 may count the number of free-running clock 117 cycles that exist in one (or more) cycles of the synchronized reference clock 111. To this, the comparator logic 135 compares the number of free-running clock 117 cycles that exist between one (or more) cycles of the frequency adjusted signal 131. Based on this comparison, the comparator logic 135 modifies the output of the correction table 120. In this fashion, the output clocks 102, 103 are adjusted.

For example, in order to synchronize the frequency adjusted signal 131 to the 8 kHz reference clock pulse 111, which ultimately synchronizes the output clocks (102, 103) with the synchronized reference clock 111, the comparator logic 135 may replace zeros with ones in the output of the correction table 120. This may be accomplished through the use of ORed logic, for example. On the other hand, if the frequency adjusted signal 131 was leading the 8 kHz synchronized reference clock 111, then the comparator logic 135 may replace ones with zeroes in the output of the correction table 120. In this fashion, the 4.096 MHz output clock 102 is phase-locked to the synchronized reference signal 111.

The accuracy of the output clocks 102, 103 may be improved by averaging out multiple frames of the synchronized reference clock 111 and calculating the deviation therefrom. As an example, for each additional frame that is sampled and compared, the accuracy may be improved by +/−80/n ppm, where n is the number of frames. For example, sampling 16 frames provides corrections to the output clocks' 102, 103 accuracy by +/−80/16 ppm or +/−5 ppm. ANSI standards may require an accuracy of +/−32 ppm for a stratum-4 clock source. Therefore, embodiments of the present invention produce an output clock 102, 103 that achieve accuracy well within ANSI stratum-4 standards.

Figure 4B:
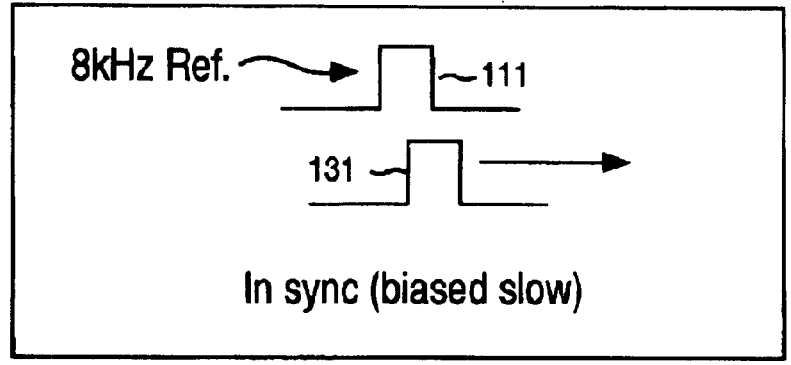

In the embodiment shown in FIG. 4B, the output clock 102, 103 is intentionally made to slightly lag the synchronized reference signal 111. The amount by which it lags may be relatively small as compared to the amount of accuracy required by ANSI stratum-4, such that the output clocks 102, 103 are still ANSI stratum-4 compliant. In this embodiment, since the output tends to lag the input, the logic can be made simpler because the adjustment only needs to be made in one direction.

A mechanism for achieving synchronization via the embodiment of FIG. 4B may be as follows. Prior to synchronization, the 8 kHz reference signal 101 may be monitored for 4 consecutive frame cycles for a stable signal. Once a stable 8 kHz reference is found, the 4.096 MHz output clock 102 is biased by +160 ppm (sped up) to allow the edges of the reference signal 101 and the frequency adjusted signal 131 to line up. Once the edges are synchronized, the 4.096 MHz output clock 102 is biased −160 ppm (slowed down) until the edges are no longer synchronized. This negative feedback mechanism will keep the two edges synchronized. This provides a pull-range of +/−160 ppm, centered on the free-running clock 117 frequency (which can be +/−30 ppm).

An embodiment of the present invention is a method of emulating a phase-locked loop. Referring now to process 500 in FIG. 5, in step 510 a clock signal (e.g., 100 MHz free-running clock 117) is received into frequency divide logic 125. For example, the free-running clock 117 is input into a clock input of a counter. The frequency divide logic 125 also receives a digital signal containing frequency modification information is received into the frequency divide logic 125. For example, a signal from the correction table 120 is input to an enable input of the frequency divide logic 125.

In step 520, the frequency divide logic 125 produces an output clock 102 or 103 by dividing the frequency of the free-running clock 117 by either a first or a second integer depending on the frequency modification signal 137. For example, the frequency divide logic 125 produces a 4.096 MHz clock 102 by dividing the frequency of the 100 MHz free-running clock 117 by 24 if the correction table output is a '1' and dividing the frequency of the 100 MHz free-running clock 117 by 25 if the correction table output is a '0'. Referring again to FIG. 2 this may be accomplished by toggling a flip-flop according to the timing shown in FIG. 2.

In step 530, the frequency of the output clock 102 is adjusted so that it substantially equals the input reference 101. For example, the frequency adjustment logic 130 divides the frequency of the 4.096 MHz clock 102 by 512 to produce an 8 kHz frequency adjusted signal 131. An appropriate pulse width for the frequency adjusted signal 131 may be achieved as described herein.

In step 540, the frequency adjusted signal 131 is fed back to comparator 135 and compared to the synchronized reference signal 111. The frequency modification signal 137 is modified in response to the comparison to substantially frequency and phase lock the frequency adjusted signal 131 to the reference signal 101. In this fashion, the output clocks 102, 103 are phase-locked to the reference signal 101.

The preferred embodiment of the present invention, a method and device for emulating a phase-locked loop, is thus described. While the present invention has been described in particular embodiments, it should be appreciated that the present invention should not be construed as limited by such embodiments, but rather construed according to the below claims.

What is claimed is:

1. A device for emulating a phase-locked loop, comprising:
   a correction table for storing a digital pattern describing how a frequency of a signal is to be altered and having a correction signal based on said digital pattern;
   first logic for receiving a base signal and altering frequency of said base signal based on said correction signal to produce an output signal near a desired frequency, said first logic dividing the frequency of said base signal by a first or a second integer based on said correction signal;
   second logic for adjusting the frequency of said output signal to the approximate frequency of a reference signal; and
   comparison logic for comparing said reference signal with said adjusted output signal and modifying said correction signal to substantially phase-lock said output signal to said reference signal.

2. The device of claim 1, further comprising synchronization logic having a first input for receiving said reference signal, a second input for receiving said base signal, and an output that is said reference signal synchronized to said base signal, and wherein said synchronized reference clock signal is input to said comparison logic.

3. The device of claim 1, wherein said comparison logic is operable to compare periods of said base signal in one or more periods of said reference signal to said output signal.

4. The device of claim 1, wherein said comparison logic is operable to change a '1' to a '0' in said correction signal in response to detecting that said adjusted output signal lags said reference signal.

5. The device of claim 1, wherein said comparison logic is operable to change a '0' to a '1' in said correction signal in response to detecting that said adjusted output signal leads said reference signal.

6. The device of claim 1, further comprising a clock source for generating said base signal.

7. The device of claim 1, wherein said device is implemented in a field programmable gate array.

8. The device of claim 1, wherein said device is implemented in an application specific integrated circuit.

9. The device of claim 1, wherein said adjusted output signal is not an integer multiple of said base signal.

10. A method of emulating a phase-locked loop, comprising:
   a) receiving a base signal into logic for altering a frequency of a signal;
   b) receiving a frequency modification signal into said logic;
   c) producing an output signal by dividing a frequency of said base signal by a first integer if said frequency modification signal is a first value and dividing said frequency of said base signal by a second integer if said frequency modification signal is a second value;

d) altering a frequency of said output signal to substantially match a frequency of a reference signal; and e) comparing said altered output signal to said reference signal and modifying said frequency modification signal in response to said comparison to substantially phase lock said output signal to said reference signal.

11. The method of claim 10, further comprising synchronizing said reference signal to said base signal.

12. The method of claim 10, wherein said e) comprises converting a one to a zero in said frequency modification signal if said altered output signal lags said reference signal.

13. The method of claim 10, wherein said e) comprises converting a zero to a one in said frequency modification signal if said altered output signal leads said reference signal.

14. The method of claim 10, wherein said c) further comprises dividing said base signal by a third integer if said frequency modification signal is said first value and dividing said base signal by a fourth integer if said frequency modification signal is said second value, wherein a second output signal is produced.

15. The method of claim 10, further comprising generating said base signal.

16. A device for emulating a phase-locked loop, comprising:

a correction table for storing a digital pattern describing how a frequency of a free-running clock is to be divided to produce a desired clock and for outputting a frequency modification signal based on said digital pattern;

first logic for dividing the frequency of said free-running clock and having a first input for receiving said free-running clock and a second input for receiving said frequency modification signal and an output that is said desired clock, said first logic operable to divide the frequency of said free-running clock by a first integer or a second integer based on said frequency modification signal;

second logic for adjusting the frequency of said desired clock to the approximate frequency of a network reference clock; and third logic for comparing said network reference clock with said adjusted desired clock and modifying said frequency modification signal, wherein said desired clock is substantially phase-locked to said network reference clock.

17. The device of claim 16, wherein said network reference clock is substantially an 8 kHz frame pulse.

18. The device of claim 16, wherein:

said network reference clock is at least stratum-4 compliant; and wherein said desired clock is stratum-4 compliant.

19. The device of claim 16, wherein said first logic for dividing is a counter.

20. The device of claim 16, wherein said second logic for dividing is a counter.

21. The device of claim 16, further comprising synchronization logic having a first input for receiving said network reference clock, a second input for receiving said free-running clock, and an output that is said network reference clock synchronized to said free-running clock.

22. The device of claim 16, wherein said first logic is operable to output additional clocks phase-locked to said network reference clock in response to said frequency modification signal.

23. The device of claim 16, wherein said correction table is programmable and wherein said digital pattern in said table is alterable to alter a frequency of said desired clock.

24. A device for emulating a phase-locked loop, comprising:

means for storing a pattern describing how a frequency of a signal is to be divided, said means outputting a correction signal based on said pattern;

means for dividing the frequency of a base signal to produce a desired signal, based upon said correction signal;

means for adjusting the frequency of said desired signal to the approximate frequency of a reference signal; and means for comparing said reference signal with said adjusted desired signal and modifying said correction signal to substantially phase-lock said desired signal to said reference signal.

25. The device for emulating a phase-locked loop of claim 24, further comprising:

means for synchronizing said reference signal to said base signal.

26. The device for emulating a phase-locked loop of claim 24, further comprising:

means for generating said base signal.

27. The device for emulating a phase-locked loop of claim 24, wherein said means for dividing the frequency of a base signal comprises a counter.

\* \* \* \* \*